United States Patent
Oh et al.

(10) Patent No.: US 11,778,854 B2
(45) Date of Patent: *Oct. 3, 2023

(54) ORGANIC ELECTROLUMINESCENT DEVICE HAVING THIN FILM ENCAPSULATION STRUCTURE AND METHOD OF FABRICATING THE SAME

(71) Applicant: Samsung Display Co., Ltd., Yongin-si (KR)

(72) Inventors: Min-Ho Oh, Yongin-si (KR); Yoon-Hyeung Cho, Yongin-si (KR); Yong-Tak Kim, Yongin-si (KR); So-Young Lee, Yongin-si (KR); Jong-Woo Kim, Yongin-si (KR); Ji-Young Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/046,654

(22) Filed: Oct. 14, 2022

(65) Prior Publication Data

US 2023/0060725 A1     Mar. 2, 2023

Related U.S. Application Data

(63) Continuation of application No. 17/646,583, filed on Dec. 30, 2021, now Pat. No. 11,489,142, which is a
(Continued)

(30) Foreign Application Priority Data

Feb. 14, 2013 (KR) .................. 10-2013-0016057

(51) Int. Cl.
*H01L 51/52* (2006.01)
*H10K 50/844* (2023.01)
*H10K 71/00* (2023.01)

(52) U.S. Cl.
CPC ......... *H10K 50/8445* (2023.02); *H10K 71/00* (2023.02)

(58) Field of Classification Search
CPC ........................... H01L 51/5256; H01L 51/56
See application file for complete search history.

(56) References Cited

U.S. PATENT DOCUMENTS 7,214,600 B2   5/2007   Won et al.
7,557,369 B2   7/2009   Humbs et al.
(Continued)

FOREIGN PATENT DOCUMENTS

CN   1441629 A    9/2003
EP   2740547 A1   6/2014
(Continued)

OTHER PUBLICATIONS

Anonymous: "Shin-Etsu Silicone: Silane coupling agents", Sep. 25, 2017, XP055409372, Retrieved from the Internet: URL:https://www.shinetsusilicone-global.com/products/type/silanecoup/index.shtml.

*Primary Examiner* — Donald L Raleigh
(74) *Attorney, Agent, or Firm* — Lewis Roca Rothgerber Christie LLP

(57) ABSTRACT

Provided is an organic electroluminescent display device, including a substrate, an organic light-emitting device on the substrate, and an encapsulation layer formed on the organic light-emitting device and the substrate. The encapsulation layer includes an inorganic layer and a polymer organic layer alternatingly stacked with an intermediate layer formed of a first organic monomer between the inorganic layer and the polymer organic layer, and one surface of the intermediate layer is bonded to the inorganic layer through bonding sites on a surface of the inorganic layer and another surface of the intermediate layer is bonded to the organic layer by polymerization.

10 Claims, 3 Drawing Sheets

Related U.S. Application Data continuation of application No. 17/170,721, filed on Feb. 8, 2021, now Pat. No. 11,245,098, which is a continuation of application No. 16/837,353, filed on Apr. 1, 2020, now Pat. No. 10,944,076, which is a continuation of application No. 16/389,696, filed on Apr. 19, 2019, now Pat. No. 10,644,264, which is a continuation of application No. 16/188,133, filed on Nov. 12, 2018, now Pat. No. 10,297,791, which is a continuation of application No. 15/725,150, filed on Oct. 4, 2017, now Pat. No. 10,128,464, which is a continuation of application No. 15/155,260, filed on May 16, 2016, now Pat. No. 9,831,468, which is a continuation-in-part of application No. 14/059,187, filed on Oct. 21, 2013, now Pat. No. 9,373,813.

(56) References Cited

U.S. PATENT DOCUMENTS

| | | |
|---|---|---|
| 7,648,925 B2 | 1/2010 | Moro et al. |
| 9,373,813 B2 | 6/2016 | Oh et al. |
| 9,670,370 B2 | 6/2017 | Iwase et al. |
| 2003/0164496 A1 | 9/2003 | Do et al. |
| 2004/0061118 A1 | 4/2004 | Yamazaki et al. |
| 2004/0229051 A1 | 11/2004 | Schaepkens et al. |
| 2004/0247949 A1 | 12/2004 | Akedo et al. |
| 2005/0041193 A1 | 2/2005 | Lifka et al. |
| 2005/0051763 A1 | 3/2005 | Affinito et al. |
| 2005/0214556 A1 | 9/2005 | Nishimi et al. |
| 2006/0022219 A1 | 2/2006 | Humbs et al. |
| 2006/0061272 A1 | 3/2006 | McCormick et al. |
| 2007/0184292 A1 | 8/2007 | Lee et al. |
| 2008/0167413 A1 | 7/2008 | Nishimi et al. |
| 2008/0305360 A1 | 12/2008 | Han et al. |
| 2008/0315188 A1 | 12/2008 | Hwang et al. |
| 2009/0202743 A1 | 8/2009 | Schaepkens et al. |
| 2009/0252863 A1 | 10/2009 | Yoshizawa |
| 2010/0207514 A1 | 8/2010 | Tanaka et al. |
| 2010/0244073 A1* | 9/2010 | Ito .................. H05B 33/04 257/E33.059 |
| 2011/0064947 A1 | 3/2011 | Aiba |
| 2011/0198627 A1 | 8/2011 | Maindron et al. |
| 2012/0256201 A1 | 10/2012 | Lee et al. |
| 2012/0256202 A1 | 10/2012 | Lee et al. |
| 2013/0337259 A1 | 12/2013 | Carcia et al. |
| 2014/0225084 A1 | 8/2014 | Oh et al. |
| 2015/0221886 A1 | 8/2015 | Klun et al. |

FOREIGN PATENT DOCUMENTS

| | | |
|---|---|---|
| KR | 10-2006-0011772 | 2/2006 |
| KR | 10-2006-0084743 | 7/2006 |
| KR | 10-2011-0000818 | 1/2011 |
| KR | 10-2012-0019599 A | 3/2012 |
| KR | 10-2012-0115840 | 10/2012 |
| KR | 10-1218651 | 1/2013 |
| WO | WO 03/050894 A2 | 6/2003 |
| WO | WO 2013/018761 A1 | 2/2013 |
| WO | WO 2014/025348 A1 | 2/2014 |

\* cited by examiner

ORGANIC ELECTROLUMINESCENT DEVICE HAVING THIN FILM ENCAPSULATION STRUCTURE AND METHOD OF FABRICATING THE SAME

CROSS-REFERENCE TO RELATED APPLICATIONS

This application is a continuation of U.S. patent application Ser. No. 17/646,583, filed Dec. 30, 2021, which is a continuation of U.S. patent application Ser. No. 17/170,721, filed Feb. 8, 2021, now U.S. Pat. No. 11,245,098, which is a continuation of U.S. patent application Ser. No. 16/837,353, filed Apr. 1, 2020, now U.S. Pat. No. 10,944,076, which is a continuation of U.S. patent application Ser. No. 16/389,696, filed Apr. 19, 2019, now U.S. Pat. No. 10,644,264, which is a continuation of U.S. patent application Ser. No. 16/188,133, filed Nov. 12, 2018, now U.S. Pat. No. 10,297,791, which is a continuation of U.S. patent application Ser. No. 15/725,150, filed Oct. 4, 2017, now U.S. Pat. No. 10,128,464, which is a continuation of U.S. patent application Ser. No. 15/155,260, filed May 16, 2016, now U.S. Pat. No. 9,831,468, which is a continuation-in-part of U.S. patent application Ser. No. 14/059,187, filed Oct. 21, 2013, now U.S. Pat. No. 9,373,813, which claims priority to and the benefit of Korean Patent Application No. 10-2013-0016057, filed Feb. 14, 2013, the entire contents of all of which are incorporated herein by reference.

BACKGROUND OF THE INVENTION

1. Field of the Invention

The present invention generally relates to an organic electroluminescent device having a thin film encapsulation structure, and more particularly, to an organic electroluminescent device having a thin film encapsulation structure, in which an inorganic layer and an organic layer are stacked, and a method of fabricating the same.

2. Description of the Related Art

Encapsulation technology of an organic light-emitting device may include substrate bonding technology for bonding an encapsulation substrate and a substrate having an organic light-emitting device formed thereon to each other, and a thin film encapsulation technology for forming an encapsulation layer in the form of a thin film without an encapsulation substrate. The bonding of the encapsulation substrate and the substrate having an organic light-emitting device formed thereon is performed by using an inorganic frit or an organic adhesive. An inorganic layer, such as AlOx, SiNx, SiOx, and SiON, on a panel may be used for thin film encapsulation.

An inorganic layer for thin film encapsulation is thin, but a density thereof is high, and thus, the inorganic layer for thin film encapsulation may have barrier characteristics with respect to moisture and oxygen. However, since an inorganic layer has brittle characteristics, mechanical properties thereof under stress may be poor. In particular, a plurality of particles may exist on a substrate during a process of fabricating an organic light-emitting device, and an inorganic layer disposed on the particles may be significantly affected by stress, and thus, the barrier characteristics of the inorganic layer may be degraded.

Therefore, a structure is introduced for planarizing an irregular surface, such as particles, by introducing an organic layer between the inorganic layers as well as relieving the stress of the inorganic layer. Acryl, silicone, and epoxy are used as the organic layer.

In general, thermal stability must be maintained at about 100° C. for the reliability of the organic light-emitting device. However, a phenomenon of peeling-off of an interface between the inorganic layer and the organic layer may occur during exposure at a high temperature for a prolonged period of time. For example, since strong chemical bonding may be difficult to be formed in the case where an acryl layer is deposited on a SiNx layer deposited through a plasma enhanced chemical vapor deposition (PECVD) process, an interface between the SiNx layer and the acryl layer may be peeled off due to heat.

SUMMARY

The present invention provides an organic light-emitting device having a stable thin film encapsulation structure by improving interfacial adhesion between an inorganic layer and an organic layer, and a method of fabricating the same.

According to an aspect of the present invention, there is provided an organic electroluminescent display device including a substrate, an organic light-emitting device on the substrate, and an encapsulation layer formed on the organic light-emitting device and the substrate. The encapsulation layer includes an inorganic layer and a polymer organic layer alternatingly stacked with an intermediate layer formed of a first organic monomer between the inorganic layer and the polymer organic layer, and one surface of the intermediate layer is bonded to the inorganic layer through bonding sites on a surface of the inorganic layer and another surface of the intermediate layer is bonded to the organic layer by polymerization.

According to another aspect of the present invention, there is provided a method of fabricating an organic electroluminescent display device including providing a substrate, forming an organic light-emitting device on the substrate, and forming an encapsulation layer including an inorganic layer and a polymer organic layer alternatingly stacked with an intermediate layer formed of a first organic monomer between the inorganic layer and the polymer organic layer on the organic light-emitting device and the substrate. One surface of the intermediate layer is bonded to the inorganic layer through bonding sites on a surface of the inorganic layer and another surface of the intermediate layer is bonded to the organic layer by polymerization.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
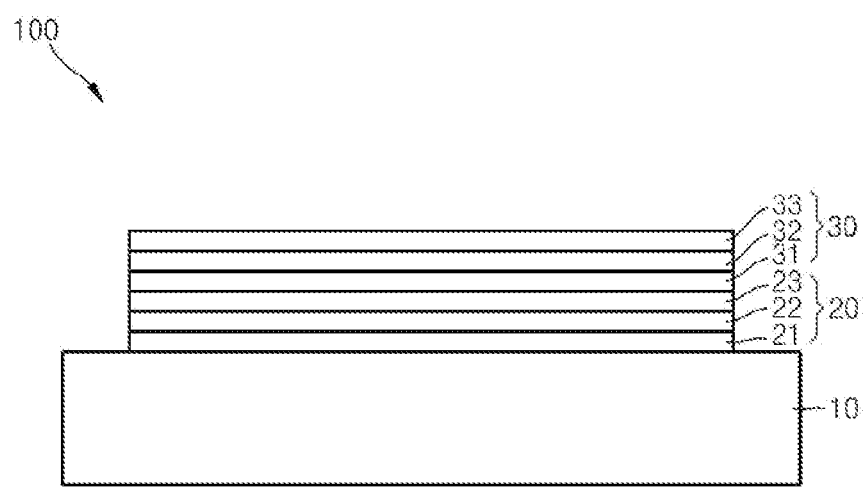
FIG. 1 is a cross-sectional view schematically illustrating an organic electroluminescent display device constructed as an embodiment according to the principles of the present invention.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view schematically illustrating an organic electroluminescent display device constructed as an embodiment according to the principles of the present invention.

An organic electroluminescent display device 100 constructed as an embodiment according to the principles of the present invention includes a substrate 10, an organic light-emitting device 20 on the substrate 10, and an encapsulation layer 30 formed on the substrate 10 to cover the organic light-emitting device 20.

Substrates formed of various materials, such as glass, plastic, silicon, or metal, may be used as the substrate 10. A buffer layer (not shown) for preventing diffusion of impurity elements or ions and infiltration of moisture from the substrate 10 to a thin film transistor (TFT) or the organic light-emitting device 20 on the substrate 10 and for planarizing a surface of the substrate 10 may be formed on a top surface of the substrate 10. Also, a TFT (not shown), as a circuit for driving the organic light-emitting device 20, is formed on the substrate 10.

The organic light-emitting device 20 includes a first electrode 21, a second electrode 23, and an organic layer 22 between the first electrode 21 and the second electrode 23.

The first electrode 21 may be an anode, and in this case, the first electrode 21 may be selected from materials having a high work function so as to facilitate hole injection. The first electrode 21 may be a transmissive electrode or a reflective electrode. The first electrode 21, for example, may be formed of indium tin oxide (ITO), indium zinc oxide (IZO), zinc oxide (ZnO), aluminum (AD-doped zinc oxide (AZO), indium oxide ($In_2O_3$), or tin oxide ($SnO_2$). The first electrode 21 may also be formed as a reflective electrode by using magnesium (Mg), silver (Ag), Al, aluminum-lithium (Al—Li), calcium (Ca), Ag-ITO, Mg—In, or Mg—Ag. The first electrode 21 may have a single layer structure or a multilayer structure having two or more layers. For example, the first electrode 21 may have a three-layer structure of ITO/Ag/ITO, but the first electrode 21 is not limited thereto.

The organic layer 22 in the organic light-emitting device 20 includes at least an emissive layer (EML) and in addition, may further include layers for hole injection and transport, electron injection and transport, and charge balance.

The second electrode 23 may be a cathode, and in this case, a metal, an alloy, an electrically conductive compound, or a mixture of two or more thereof having a low work function may be used as the second electrode 23. The second electrode 23, for example, may be included as a transparent electrode or a reflective electrode. In the case that the second electrode 23 is included as a transparent electrode, the second electrode 23 may include a thin film formed of Li, Ca, Al, Mg, Mg—In, Mg—Ag, LiF—Al, LiF—Ca, or a compound thereof and an auxiliary electrode formed of a transparent conductive material, such as ITO, IZO, ZnO, or $In_2O_3$, disposed thereon. Alternatively, in the case that the second electrode 23 is included as a reflective electrode, the second electrode 23 may be formed of Li, Ca, Al, Mg, Mg—In, Mg—Ag, LiF—Al, LiF—Ca, or a compound thereof.

The encapsulation layer 30 is composed of an inorganic layer 31 and an organic layer 33 alternatingly stacked with an intermediate layer 32 between the inorganic layer 31 and the organic layer 33.

The inorganic layer 31, for example, may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, magnesium oxide, or hexamethyldisiloxane (HMDSO). An optimum thickness of the inorganic layer 31 may be determined according to productivity or device characteristics. The inorganic layer 31 is thin, but a density thereof is high, and thus, the inorganic layer 31 may have barrier characteristics with respect to moisture and oxygen.

The organic layer 33 may be formed of an acryl-based resin, a methacryl-based resin, an isoprene-based resin, a vinyl-based resin, an epoxy-based resin, a urethane-based resin, a cellulose-based resin, a perylene-based resin, an imide-based resin, or a mixture of two or more thereof. For example, the organic layer 33 may be formed to include the second organic monomer which may comprise hexamethyldisiloxane (HMDSO); a monomer of an acryl-based resin, a methacryl-based resin, an isoprene-based resin, a vinyl-based resin, an epoxy-based resin, a urethane-based resin, a cellulose-based resin, a perylene-based resin and an imide-based resin. An optimum thickness of the organic layer 33 may be determined according to characteristics of the inorganic layer 31, productivity, and device characteristics. The organic layer 33 may act to relieve stress of the inorganic layer 31 and planarize the inorganic layer 31.

One surface of the intermediate layer 32 is bonded to the inorganic layer 31 through bonding sites on a surface of the inorganic layer 31, and another surface of the intermediate layer 32 is bonded to the organic layer 33 by polymerization. The intermediate layer 32 may be formed of a material which may be bonded to a bonding site, such as oxygen, on the surface of the inorganic layer 31 and may be bonded to the organic layer 33 by polymerization. The intermediate layer 32 may be formed of a first organic monomer which is an organic compound including a polymerizable double bond. For example, the first organic monomer comprises methacrylate, acrylate, or epoxy. For example, a hydroxyl or carbonyl moiety of methacrylate may be bonded to a bonding site, e.g., an oxygen or hydrogen atom, on the surface of the inorganic layer 31 and/or a carbonyl or carbon-carbon double bond moiety thereof may be bonded to the organic layer 33 by polymerization. An optimum thickness of the intermediate layer 32 may be determined according to a degree of adhesion between the inorganic layer 31 and the organic layer 33. For example, the intermediate layer 32 may be formed to a thickness of a few tens of angstrom (Å), but the thickness of the intermediate layer 32 is not limited thereto.

In the encapsulation layer 30, the pluralities of organic layers 33 and inorganic layers 31 may be alternatingly stacked and the intermediate layer 32 may be disposed between the organic layer 33 and the inorganic layer 31.

Since the intermediate layer 32 is bonded to the organic layer 33 and the inorganic layer 31, adhesion between the organic layer 33 and the inorganic layer 31 is improved, and thus, occurrence of peeling-off due to thermal stress and deformation may be prevented.

Hereinafter, a method of fabricating an organic electroluminescent display device according to an embodiment of the present invention will be described.

First, a substrate 10 is provided. Substrates formed of various materials, such as glass, plastic, silicon, or metal, may be used as the substrate 10. A buffer layer (not shown) for preventing diffusion of impurity elements or ions and infiltration of moisture from the substrate 10 to a TFT or an organic light-emitting device 20 above the substrate 10 and for planarizing a surface of the substrate 10 may be formed on a top surface of the substrate 10. Also, a TFT (not shown), as a circuit for driving the organic light-emitting device 20, is formed on the substrate 10.

The organic light-emitting device 20 electrically connected to the TFT (not shown) is formed on the substrate 10. The organic light-emitting device 20 includes a first electrode 21, a second electrode 23, and an organic layer 22 between the first electrode 21 and the second electrode 23.

The first electrode 21 may be an anode, and in this case, the first electrode 21 may be formed by selecting a material having a high work function so as to facilitate hole injection. The first electrode 21 may be a transmissive electrode or a reflective electrode. The first electrode 21, for example, may be formed of ITO, IZO, ZnO, AZO, $In_2O_3$, or $SnO_2$. The first electrode 21 may also be formed as a reflective electrode by using Mg, Ag, Al, Al—Li, Ca, Ag-ITO, Mg—In, or Mg—Ag. The first electrode 21 may be formed as a single layer structure or a multilayer structure having two or more layers. The first electrode 21 may be formed by evaporation or sputtering.

The organic layer 22 includes at least an EML and in addition, may further include a hole injection layer (HIL), a hole transport layer (HTL), an electron transport layer (ETL), and an electron injection layer (EIL). The organic layer 22 may be formed of a low molecular weight or high molecular weight material, and may be formed by using various methods, such as a vacuum deposition method, a spin coating method, a casting method, and a Langmuir-Blodgett (LB) method.

The hole injection layer may be formed of a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-Tris(N,N-diphenylamino)triphenylamine (TDATA), 4,4',4''-tris{N,-(2-naphthyl)-N-phenylamino}-triphenylamine (2T-NATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or polyaniline/poly(4-styrenesulfonate) (PANI/PSS). However, the hole injection layer is not limited thereto.

The hole transport layer may be formed of a carbazole derivative, such as N-phenylcarbazole and polyvinylcarbazole, and a triphenylamine-based material such as N,N'-bis(3-methylphenyl)-N,N'-diphenyl-[1,1-biphenyl]-4,4'-diamine (TPD), N,N'-di(1-naphthyl)-N,N'-diphenylbenzidine (NPB), or 4,4',4''-tris(N-carbazolyl)triphenylamine (TCTA). However, the hole transport layer is not limited thereto.

The electron transport layer may be formed of $Alq_3$, 2,9-dimethyl-4,7-diphenyl-1,10-phenanthroline (BCP), 4,7-diphenyl-1,10-phenanthroline (Bphen), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), beryllium bis(benzoquinolin-10-olate) ($Bebq_2$), or 9,10-di(naphthalene-2-yl)anthracene (ADN). However, the electron transport layer is not limited thereto.

The electron injection layer may be formed by using a material such as LiF, NaCl, CsF, $Li_2O$, BaO, and Liq.

The emissive layer may be formed to include a host material and a dopant material.

Examples of the host may be tris-(8-quinolinolato)aluminum ($Alq_3$), 4,4'-bis(N-carbazolyl)-1,1'-biphenyl (CBP), poly(n-vinylcabazole) (PVK), ADN, TCTA, 1,3,5-tris(N-phenylbenzimidazole-2-yl)benzene (TPBI), 3-tert-butyl-9,10-di(naphtha-2-yl)anthracene (TBADN), distyrylarylene (DSA), E3, or 4,4'-bis(9-carbazolyl)-2,2'-dimethyl-biphenyl (CDBP). However, the host is not limited thereto.

Examples of the dopant may be Pt(II) octaethylporphine (PtOEP), tris(2-phenylisoquinoline)iridium ($Ir(piq)_3$), bis(2-(2'-benzothienyl)-pyridinato-N,C3')iridium(acetylacetonate) ($Btp_2Ir(acac)$), tris(2-phenylpyridine)iridium ($Ir(ppy)_3$), Bis(2-phenylpyridine)(Acetylacetonato)iridium(III) ($Ir(ppy)_2(acac)$), tris(2-(4-tolyl)phenylpyridine)iridium ($Ir(mppy)_3$), 10-(2-benzothiazolyl)-1,1,7,7-tetramethyl-2,3,6,7-tetrahydro-1H,5H,11H-[1]benzopyrano[6,7,8-ij]quinolizin-11-one (C545T), Bis[3,5-difluoro-2-(2-pyridyl)phenyl](picolinato)iridium(III) ($F_2Irpic$), $(F_2ppy)_2Ir(tmd)$, $Ir(dfppz)_3$, 4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe). However, the dopant is not limited thereto.

The second electrode 23 may be a cathode, and in this case, the second electrode 23 may be formed by using a metal, an alloy, an electrically conductive compound, or a mixture of two or more thereof having a low work function. The second electrode 23, for example, may be formed as a transparent electrode or a reflective electrode. In the case that the second electrode 23 is a transparent electrode, the second electrode 23 may be formed as a thin film formed of Li, Ca, Al, Mg, Mg—In, Mg—Ag, LiF—Al, LiF—Ca, or a compound thereof and an auxiliary electrode formed of a transparent conductive material, such as ITO, IZO, ZnO, or $In_2O_3$, disposed thereon. Alternatively, in the case where the second electrode 23 is a reflective electrode, the second electrode 23, for example, may be formed of Li, Ca, Al, Mg, Mg—In, Mg—Ag, LiF—Al, LiF—Ca, or a compound thereof. The second electrode 23 may be formed by sputtering or vacuum deposition.

An encapsulation layer 30 is formed on the organic light-emitting device 20.

The encapsulation layer 30 is composed of an inorganic layer 31 and an organic layer 33 alternatingly stacked with an intermediate layer 32 between the inorganic layer 31 and the organic layer 33.

The inorganic layer 31, for example, may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. An optimum thickness of the inorganic layer 31 may be determined according to productivity or device characteristics. The inorganic layer 31 may be formed by using a method such as chemical vapor deposition (CVD), plasma enhanced chemical vapor deposition (PECVD), sputtering, atomic layer deposition (ALD), or thermal evaporation.

Bonding sites to be bonded to the intermediate layer 32 are formed on the surface of the inorganic layer 31. The bonding sites, for example, may be an oxygen atomic layer. For this purpose, the surface of the inorganic layer 31 may be treated with oxygen plasma or ozone plasma. An M-H bond on the surface of the inorganic layer 31 may be changed to an M-OH bond by such an oxygen or ozone plasma treatment, where M denotes silicon or metal elements of the inorganic layer 31, such as silicon, aluminum, titanium, tantalum, hafnium, zirconium, cerium, tin, or magnesium.

A preliminary intermediate layer (not shown) is formed on the surface-treated inorganic layer 31 by using a first organic monomer having a polymerizable double bond, such as a vinyl group or a carbonyl group, and a photopolymerization initiator. For example, the preliminary intermediate layer (not shown) may be formed of the first organic monomer comprising methacrylate, acrylate, or epoxy. Examples of the photopolymerization initiator may be an acetophenone-based compound, a benzophenone-based compound, a thioxanthone-based compound, a benzoin-based compound, and a triazine-based compound. However, the preliminary intermediate layer is not limited thereto. The above materials may be used alone or by mixing two or more thereof.

The preliminary intermediate layer (not shown) may be formed by using a flash evaporation method, an inkjet process, a screen printing method, a spin coating method, or an initiated chemical vapor deposition (iCVD) method forming vapor phase radicals at high temperatures. The preliminary intermediate layer (not shown) may be formed to a thickness of a few tens of angstrom (Å), but the thickness of the preliminary intermediate layer is not limited thereto. The organic monomer of the preliminary intermediate layer (not shown) may be bonded to the bonding sites of the inorganic layer 31.

Next, a preliminary organic layer (not shown) may be formed on the preliminary intermediate layer (not shown) by using a second organic monomer. The preliminary organic layer (not shown), for example, may be formed of an acryl-based resin, a methacryl-based resin, an isoprene-based resin, a vinyl-based resin, an epoxy-based resin, a urethane-based resin, a cellulose-based resin, a perylene-based resin, an imide-based resin, or a mixture thereof. For example, the second organic monomer may comprise hexamethyldisiloxane (HMDSO); a monomer of an acryl-based resin, a methacryl-based resin, an isoprene-based resin, a vinyl-based resin, an epoxy-based resin, a urethane-based resin, a cellulose-based resin, a perylene-based resin and an imide-based resin. The preliminary organic layer (not shown), for example, may be formed by using a method such as a flash evaporation method, an inkjet process, a screen printing method, or a spin coating method.

Subsequently, the preliminary intermediate layer (not shown) and the preliminary organic layer (not shown) are cured by using ultraviolet (UV) or heat. A vinyl group of the first organic monomer of the preliminary intermediate layer (not shown) is polymerized with the second organic monomer of the preliminary organic layer (not shown), and the second organic monomer of the preliminary organic layer (not shown) is polymerized with the first organic monomer of the preliminary intermediate layer (not shown) and another monomer of an organic layer (not shown). After a curing process, the preliminary intermediate layer (not shown) becomes the intermediate layer 32 and the preliminary organic layer (not shown) becomes the organic layer 33. Thus, the intermediate layer 32 is bonded to the organic layer 33 according to such polymerizations and the organic layer 33 forms a resin layer or a polymer layer.

Figure 2:
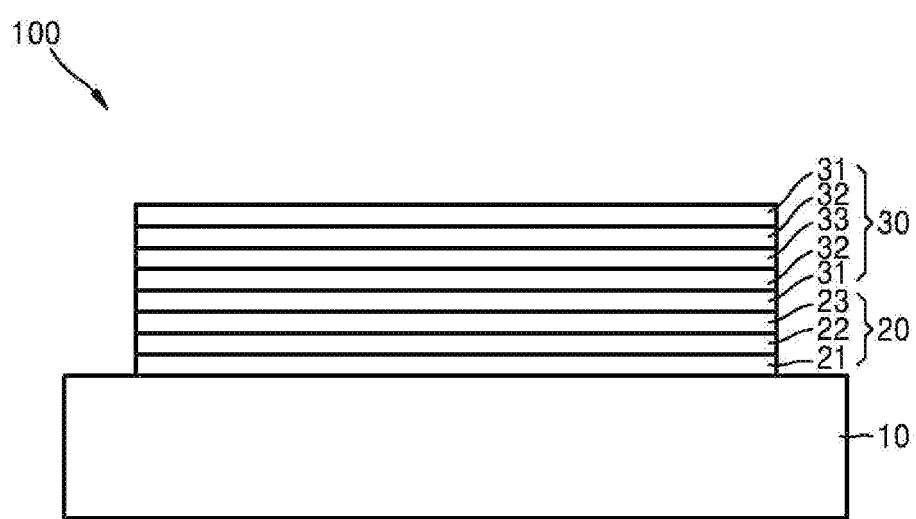
FIG. 2 is a cross-sectional view schematically illustrating an organic electroluminescent display device 100 constructed as another embodiment according to the principles of the present invention.

FIG. 2 is a cross-sectional view schematically illustrating an organic electroluminescent display device 100 constructed as another embodiment according to the principles of the present invention. In FIG. 2, descriptions of substrate 10, an organic light-emitting device 20, a first electrode 21, an organic layer 22, a second electrode 23, an encapsulation layer 30, an inorganic layer 31, intermediate layer 32 and an an organic layer 33 may be understood by referring to the descriptions provided herein.

Figure 3:
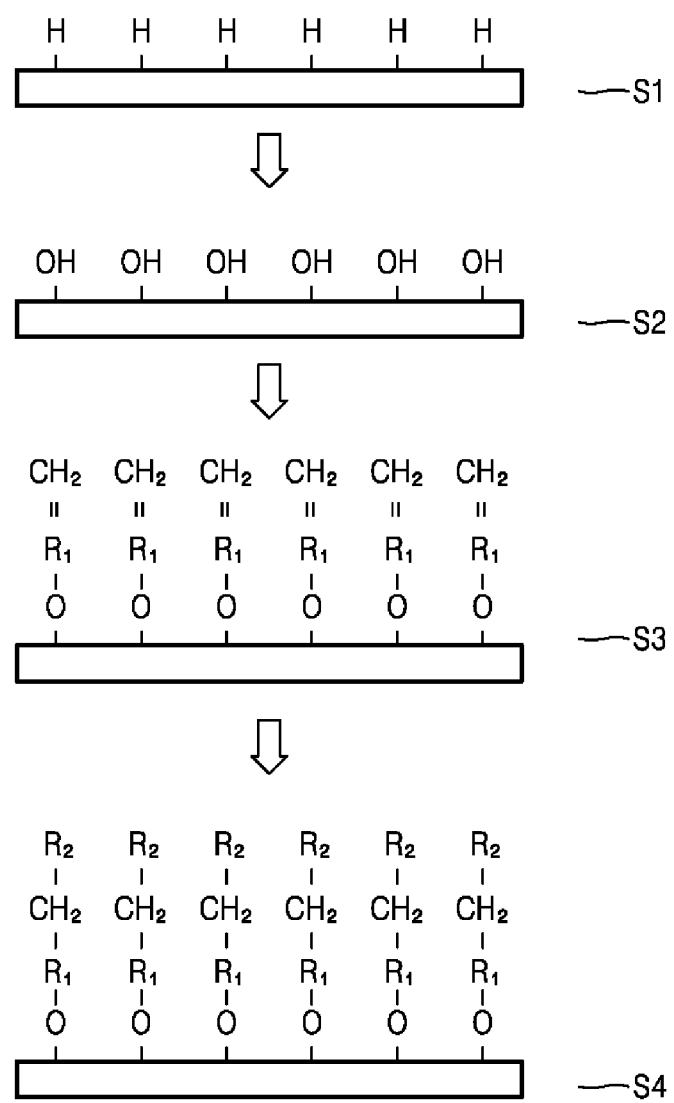
FIG. 3 is a diagram conceptually illustrating a process in which an intermediate layer forms a bond between an inorganic layer and an organic layer.

FIG. 3 is a diagram conceptually illustrating a process, in which an intermediate layer forms a bond between an inorganic layer and an organic layer, according to an embodiment of the present invention.

Referring to FIG. 3, in step S1, the inorganic layer having a —H bond on a surface of the inorganic layer is prepared.

Then in step S2, the —H bond on the surface of the inorganic layer is changed to a —OH bond by a surface treatment.

In step S3, a preliminary intermediate layer, in which a part $R_1$ is bonded to O of the inorganic layer and a vinyl group faces a surface, is formed on the surface-treated inorganic layer by using $R_1$=$CH_2$, an organic monomer having a vinyl group.

Next, in step S4, a preliminary organic layer is formed by using an organic monomer $R_2$; and then the organic monomer $R_2$ and the vinyl group of the preliminary intermediate layer are polymerized by curing to form a bond.

The intermediate layer thus is bonded to the organic layer and the inorganic layer, and as a result, adhesion between the organic layer and the inorganic layer is improved. Therefore, occurrence of peeling-off due to thermal stress may be prevented. Meanwhile, the bonding sites on the surface of the inorganic layer are not limited to only —OH and the polymerizable group of the organic monomer of the preliminary intermediate layer is not limited to only a vinyl group.

Since an intermediate layer is bonded to an organic layer and an inorganic layer, adhesion between the organic layer and the inorganic layer are improved, and thus, occurrence of peeling-off due to thermal stress may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
   a substrate;
   a light-emitting device on the substrate; and
   an encapsulation layer on the light-emitting device and the substrate,
   wherein the encapsulation layer comprises a first inorganic layer, and a second inorganic layer,
   wherein the first inorganic layer is the closest layer of the encapsulation layer to the substrate,
   wherein the second inorganic layer comprises a third region and a fourth region,
   wherein the third region is between the first inorganic layer and the fourth region, and
   a concentration of oxygen in the third region is greater than a concentration of oxygen in the fourth region.

2. The display device of claim 1, wherein the third region has a portion having a maximum oxygen concentration in the second inorganic layer.

3. The display device of claim 1, wherein the second inorganic layer comprises silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, magnesium oxide or hexamethyldisiloxane (HMDSO).

4. The display device of claim 1, wherein the second inorganic layer comprises silicon nitride, aluminum nitride, titanium nitride, tantalum nitride, hafnium nitride, zirconium nitride, cerium nitride, or tin nitride.

5. The display device of claim 1, wherein the light-emitting device comprises an organic light-emitting device comprising a first electrode, a second electrode, and an organic emissive layer between the first electrode and the second electrode.

6. The display device of claim 5, wherein the organic light-emitting device further comprises at least one of a hole injection layer, a hole transport layer, an electron injection layer, or an electron transport layer between the first electrode and the second electrode.

7. The display device of claim 1, wherein the encapsulation layer further comprises a polymer layer between the first inorganic layer and the second inorganic layer,
wherein the second inorganic layer of the encapsulation layer contacts the polymer layer.

8. The display device of claim 7, wherein the polymer layer is derived from a first organic monomer comprising methacrylate, acrylate, or epoxy.

9. The display device of claim 7, wherein one surface of the polymer layer is in contact with the first inorganic layer,
wherein the inorganic layer comprises a first region and a second region between the first region and the polymer layer, and
a concentration of oxygen in the second region is greater than a concentration of oxygen in the first region.

10. The display device of claim 9, wherein the second region has a portion having a maximum oxygen concentration in the inorganic layer.

* * * * *